US009768498B2

(12) United States Patent
Luong et al.

(10) Patent No.: US 9,768,498 B2
(45) Date of Patent: Sep. 19, 2017

(54) HIGH FREQUENCY MULTIPLE-CHANNEL ANTENNA, PARTICULARLY FOR A NUCLEAR MAGNETIC RESONANCE IMAGING DEVICE

(71) Applicant: Commissariat à l'énergie atomique et aux énergies alternatives, Paris (FR)

(72) Inventors: Michel Luong, Sceaux (FR); Guillaume Ferrand, Paris (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 671 days.

(21) Appl. No.: 14/192,526

(22) Filed: Feb. 27, 2014

(65) Prior Publication Data
US 2014/0239953 A1 Aug. 28, 2014

(30) Foreign Application Priority Data
Feb. 27, 2013 (FR) ...................... 13 51723

(51) Int. Cl.
*G01R 33/36* (2006.01)
*H01Q 1/52* (2006.01)
(Continued)

(52) U.S. Cl.
CPC ........... *H01Q 1/523* (2013.01); *G01R 33/365* (2013.01); *G01R 33/3415* (2013.01); *H01Q 7/005* (2013.01)

(58) Field of Classification Search
CPC ................... H01Q 1/523; H01Q 7/005; G01R 33/34–33/3456; G01R 33/3657;
(Continued)

(56) References Cited

U.S. PATENT DOCUMENTS 5,510,714 A * 4/1996 Takahashi ........ G01R 33/34046
324/318
6,028,429 A * 2/2000 Green .............. G01R 33/34061
324/318
(Continued)

FOREIGN PATENT DOCUMENTS

EP 2 447 732 5/2012
WO WO 2009/081359 7/2009

OTHER PUBLICATIONS

Roemer, P. B., et al., "The NMR Phased Array," Magnetic Resonance in Medicine, vol. 16, 1990, pp. 192-225.
(Continued)

*Primary Examiner* — Clayton E Laballe
*Assistant Examiner* — Ruifeng Pu
(74) *Attorney, Agent, or Firm* — Pillsbury Winthrop Shaw Pittman LLP

(57) ABSTRACT

A multiple-channel antenna includes a first loop resonator including a radiating element forming a loop; a second resonator adjacent to the first loop resonator including a radiating element; wherein the radiating element of the first loop resonator has a main surface defined along a first median plane; a secondary surface defined along a second median plane, the secondary surface delimiting an appendix of the radiating element placed facing the second resonator and having an inclination relative to the median plane of the main surface and wherein the second resonator is a linear resonator with a straight radiating element.

11 Claims, 3 Drawing Sheets

(51) Int. Cl.
*H01Q 7/00* (2006.01)
*G01R 33/3415* (2006.01)

(58) Field of Classification Search
CPC .......... G01R 33/34046; G01R 33/3678; G01R 33/34076; G01R 33/3642
See application file for complete search history.

(56) References Cited

U.S. PATENT DOCUMENTS

| | | |
|---|---|---|
| 2004/0066195 A1 | 4/2004 | Reykowski |
| 2007/0285096 A1* | 12/2007 | Soutome .......... G01R 33/34046 324/318 |
| 2008/0231278 A1 | 9/2008 | Ishihara et al. |
| 2011/0121834 A1* | 5/2011 | Soutome .............. G01R 33/365 324/318 |
| 2012/0262173 A1* | 10/2012 | Soutome .......... G01R 33/34076 324/309 |
| 2014/0253126 A1* | 9/2014 | Habara .............. G01R 33/3415 324/322 |

OTHER PUBLICATIONS

Lee, R., et al., "Coupling and Decoupling Theory and Its Application to the MRI Phased Array," Magnetic Resonance in Medicine, vol. 48, 2002, pp. 203-213.

Adriany, G., et al., "Transmit and Receive Transmission Line Arrays for 7 Tesla Parallel Imaging," Magnetic Resonance in Medicine, vol. 53, 2005, pp. 434-445.

\* cited by examiner

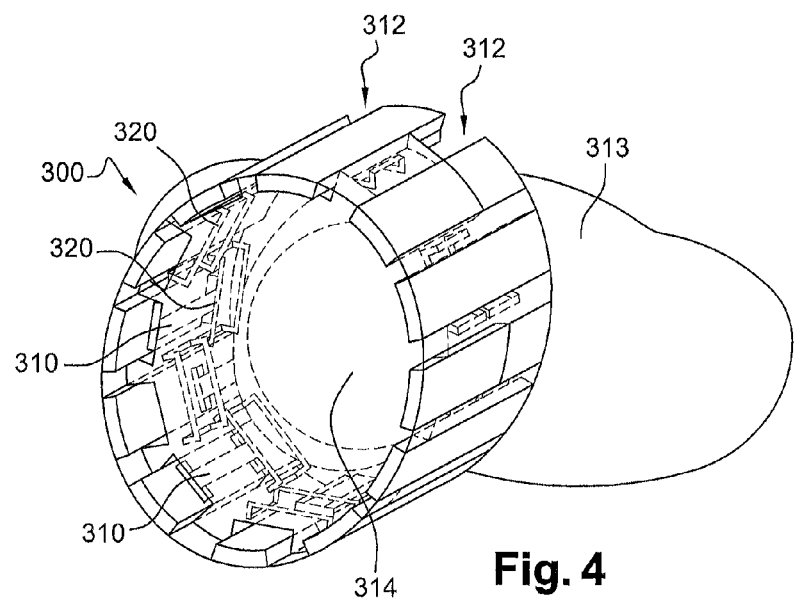
Fig. 4
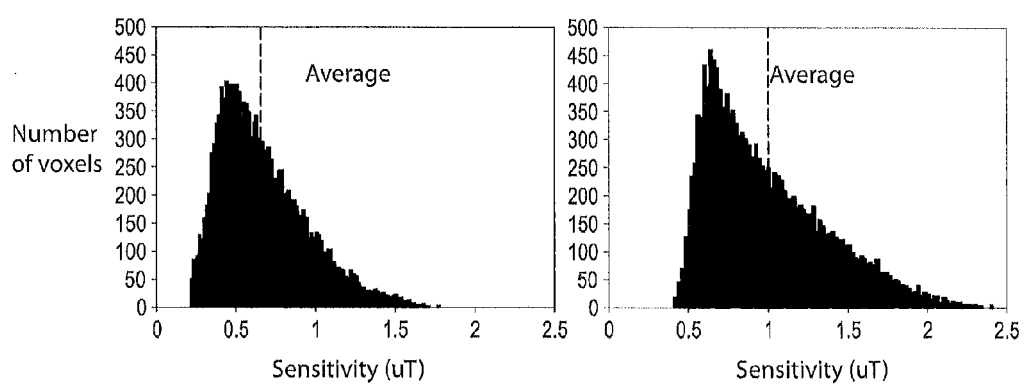
Fig. 5a  Fig. 5b

HIGH FREQUENCY MULTIPLE-CHANNEL ANTENNA, PARTICULARLY FOR A NUCLEAR MAGNETIC RESONANCE IMAGING DEVICE

CROSS REFERENCES TO RELATED APPLICATIONS

This application claims priority to French Patent Application No. 1351723, filed Feb. 27, 2013, the entire content of which is incorporated herein by reference in its entirety.

FIELD

This invention relates to a high frequency multiple-channel antenna in reception and/or in transmission used in Nuclear Magnetic Resonance (NMR) devices and their applications; Magnetic Resonance Imaging (MRI) for men or animals, Magnetic Resonance Spectroscopy (MRS) or diffusion tensor imaging.

The field of the invention is multiple-channel antennas functioning in near field, used particularly in the field of Nuclear Magnetic Resonance (NMR) including the following applications.

The invention is particularly applicable to high frequency multiple-channel antennas in reception and/or in transmission used for the examination of a complete human body or only part of the body, for example such as a head, in NMR devices and more particularly in Magnetic Resonance Imaging (MRI) devices with very high magnetic field, in other words more than 7 Teslas. The function of these devices is to excite magnetic spins of hydrogen atoms of the sample located inside the antenna, and to collect the radiofrequency signal that they emit during the relaxation described below.

BACKGROUND

Antennas of the MRI devices are formed in a known manner using radiating elements with variable shapes made of copper, acting either as transmitting coils in resonance with the circuit that powers it, or as relaxation signal receivers, or both of these functions alternately. They surround the patient or only the part of the body to be analysed.

Placed in the permanent longitudinal magnetic field $B_0$ of an NMR device, they receive an electrical excitation by which they produce the magnetic field $B_1$ orthogonal to $B_0$ at the resonant precession or relaxation frequency (also called the Larmor frequency) of the nuclei of the studied atoms that are located in the magnetic field $B_0$ and/or pick up the radiofrequency (RF) signal at the same resonant frequency of nuclei that were temporarily submitted to the magnetic field $B_1$.

Remember that magnetic spin moments of hydrogen atom nuclei will progressively align under the effect of the static magnetic field $B_0$ along a direction initially parallel to the magnetic field $B_0$ and will result in global magnetisation along the direction of the field $B_0$ called the longitudinal direction z.

When an excitation is applied in pulse form, in other words a radiofrequency field oscillating at the Larmor frequency with a magnetic component denoted $B_1$, perpendicular to $B_0$, the magnetic spin moments will resonate and progressively separate from this longitudinal axis z to move to an inclination angle denoted FA relative to this initial axis describing a movement called a precession movement. Therefore the radiofrequency field $B_1$ can "tilt" the magnetic spin moments at an inclination angle FA relative to the direction of the field $B_0$.

When excitation is interrupted, the magnetic spin moments that separated from their initial axis return to their equilibrium position, in other words the z axis, without stopping rotating. This return to equilibrium is called relaxation. It is then possible to measure this spin rotation movement in the form of a very weak radiofrequency field picked up by the antenna, the picked up radiofrequency field having the same frequency as the exciter radiofrequency field, in other words the Larmor resonant frequency.

Antennas are designed to radiate the pulse magnetic field B1, or to receive signals generated by relaxation of nuclei and preferably to perform these two functions at successive times.

In particular, antennas used for examination of a part of the body and particularly the head, are antennas functioning in near magnetic field, in other words close to radiating physical elements.

Array type antennas have been developed to operate at frequencies of more than 128 MHz. They are formed by a distribution of a plurality of resonators, usually between 8 and 32, acting as transmitters and/or receivers and that are distributed around the sample to be measured.

Each resonator has a specific channel for emission and/or a specific channel for reception of the radiofrequency signal.

In reception, each resonator can thus produce an image of the anatomic region facing which the image is located. The different images are then combined by algorithms to form the final image.

Operation of array type antennas is characterised by non-uniformity of the radiofrequency magnetic fields emitted or received by a single resonator: $B_1^+$ in emission and $B_1^-$ in reception. The quantity of field $B_1^+$ corresponds to circular polarisation of the magnetic field rotating in the same direction as the nuclear spins used for imaging. By opposition, the field quantity $B_1^-$ corresponds to the circular polarisation of the magnetic field that rotates in the inverse direction and that characterises the sensitivity in reception.

In emission, non-uniformity of $B_1^+$ results in the appearance of shaded zones or zones with artificial contrast on the image that are difficult to interpret. An array antenna formed by a plurality of resonators are used to overcome this, specifically to:
  make $B_1^+$ directly uniform;
  make the inclination angle uniform.

This compensation for non-uniformity of $B_1^+$ is more efficient when the number of resonators in an array antenna is high.

In reception, a larger number of resonators provides a more uniform global reception profile with an increase in the signal-to-noise ratio as described in document [1] (Roemer, P. B. et al. (1990), *The NMR phased array, Magnetic Resonance Medicine*, 16: 192-225). This increase in the signal-to-noise ratio may be used profitably to increase the resolution of the image or to reduce the acquisition time using an acceleration method that uses the differential sensitivity between the resonators due to their construction or their distribution around the sample.

In brief, the improvement of the capacities and performances of an array antenna depends on an increase in the number of resonators. This approach is more efficient if the size of each resonator remains unchanged. The result is necessarily a reduction in the distance between adjacent resonators that causes an increase in mutual coupling between adjacent resonators. For the same emission efficiency (or reception sensitivity), the increase in mutual coupling is observed by an increase in the transmission coefficient of the radiofrequency signal between the terminals (or radiofrequency ports) of adjacent resonators.

High mutual coupling has three main disadvantages:

an adjustment (i.e. frequency or impedance matching) which is difficult for each resonator because the adjustment of a resonator depends on the adjustment of adjacent resonators;

a loss of efficiency in emission because some of the injected power is dissipated in the circulator load or in the internal resistance of power amplifiers that supply power to adjacent resonators;

an increase in the noise on reception because each resonator receives noise specific to adjacent resonators.

A first analysis based on the circuit theory disclosed in document [2] (Lee, R. F. et al. (2002), *Coupling and decoupling theory and its application to the MRI phased array. Magnetic Resonance Medicine*, 48: 203-213), can be used to propose a solution for the mutual coupling problem. Efficient decoupling is possible when the characteristics of a resonator can be modelled precisely. However, the difficulty encountered in applying this theory is the result of the strong interaction at high frequency of resonators with the sample to be imaged placed in the antenna, and that modifies model parameters.

Two families of array type antennas are known:

antennas with linear resonators formed from straight copper strips inserted inside an insulating body using the microstrip technique, and usually incorrectly referred to as "antenna strip-line", and antennas comprising loop resonators, often formed from a copper strip glued onto a frequently flexible insulating body applied directly onto the sample to be analysed.

Example embodiments have been described in document [3] (Adriany, G, et al. (2005), *Transmit and receive transmission line arrays for 7 Tesla parallel imaging, Magnetic Resonance in Medicine* 53: 434-445).

Due to the geometric configuration of resonators, mutual coupling is weaker between two adjacent linear resonators than between two adjacent loop resonators, for a given number of resonators in a given space. Consequently, the mutual coupling problem is more severe for antennas comprising loop resonators.

Document [1] describes a method for decoupling loop resonators that consists of superposing loop resonators. Such a solution can lead to a complex configuration that is difficult to implement in practice with patients.

A second known decoupling method consists of adding a passive circuit between two adjacent resonators as described in document [4], (Birl, M. et al. (2005), Surface Coils Decoupling Means for MRI Systems, U.S. Pat. No. 6,927, 575 B2).

A third method overcomes mutual coupling problems by combining two resonator technologies, namely linear resonator and loop resonator and using linear resonators in transmission and loop resonators in reception, the resonators operating simultaneously. However, such a configuration cannot optimise the number of resonators in transmission and in reception, therefore there is a loss of efficiency of the antenna. When loop resonators are only used in reception, decoupling can also be achieved by a judicious choice or optimum transformation of the impedance of preamplifiers, as described in document [5] (Yoshida Masaru et al. (2001), RF Coil Array with Reduced Intercoil Coupling, European Patent EP1122550).

If linear resonators are used only in reception, decoupling can also be done using capacitors as described in document [6] (Vaughan, J. T. et al. (2011), Coil Element Decoupling for MRI, US Patent US2011/0312499).

However, none of the described solutions is satisfactory for a Magnetic Resonance Imaging (MRI) application with a very high magnetic field. Furthermore, the disclosed solutions are complex to implement and expensive and require the addition of additional components and electrical circuits.

SUMMARY

In this context, an aspect of the invention aims at solving the problems mentioned above by disclosing a high performance high frequency antenna with multiple channels that has a simple design in order to eliminate or at least reduce mutual coupling problems of two adjacent resonators.

To achieve this, an embodiment of the invention discloses a multiple-channel antenna comprising:

a first loop resonator comprising a radiating element forming a loop;

a second resonator adjacent to the first loop resonator comprising a radiating element;

wherein the radiating element of the first loop resonator has:

a first main surface S1 defined in a first median plane;

a secondary surface S2 defined in a second median plane, the secondary surface delimiting an appendix of the radiating element placed facing the second resonator, and with an inclination from the median plane of the main surface S1;

and wherein the second resonator is a linear resonator with a straight radiating element.

A multiple-channel antenna refers to an antenna with a plurality of resonators acting as transmitters and/or receivers and that are distributed around the sample to be measured.

With the invention, mutual decoupling is efficient because the lines of magnetic field radiated by resonators are globally orthogonal, and also due to the interpretation of edge effects generated by the inclination of a small portion of the loop resonator along a line parallel to the axis of the second resonator adjacent to the loop resonator.

Therefore the folded portion of the radiating element of the loop resonator cancels out the current induced in the loop resonator due to the presence of the second adjacent resonator. Consequently, the height of the appendix, its size relative to the surface S1 and the angle of inclination relative to the surface S1 are adjustment parameters that are used to cancel out the current induced in the loop resonator.

Beneficially, the antenna is a high frequency antenna capable of functioning at frequencies exceeding 128 MHz.

The antenna according to an embodiment of the invention can also have one or several of the characteristics described below, taken individually or in any technically possible combination:

the secondary surface S2 delimitating the appendix is smaller than the main surface;

the ratio between the secondary surface S2 and the main surface S1 is less than $1/4$;

the radiating element of the loop resonator has a folding zone delimiting the main surface S1 and the secondary surface S2;

the first main surface S1 is a plane or curved surface;

the secondary surface S2 is a plane or curved surface;

the angle of inclination α of the appendix relative to the main surface S1 of the first loop resonator is between 45° and 135°;

the radiating element of the first loop resonator and the radiating element of the second resonator are used to transmit a radiofrequency excitation signal and to receive a radiofrequency relaxation signal;

the radiating element of the first loop resonator is used to receive a radiofrequency relaxation signal and said radiating element of the second resonator is used to transmit a radiofrequency excitation signal and to receive a radiofrequency relaxation signal;

the antenna comprises a third resonator adjacent to the first loop resonator such that the second resonator and the third resonator are placed on each side of the first loop resonator, the first loop resonator having a second appendix facing the third resonator and with an inclination α relative to the median plane of the main surface S1;

the antenna is a high frequency antenna for a nuclear magnetic resonance device.

BRIEF DESCRIPTION OF THE FIGURES

Other characteristics and benefits of the invention will become clearer after reading the following description given for guidance and in no way limitative, with reference to the appended figures among which:

FIG. 4 shows a simplified example of a second embodiment of a high frequency antenna with multiple channels according to the invention;

FIGS. 5a and 5b are histograms showing the distribution of reception sensitivities obtained with an antenna according to the state of the art and an antenna according to an embodiment of the invention respectively.

DETAILED DESCRIPTION

Figure 1:
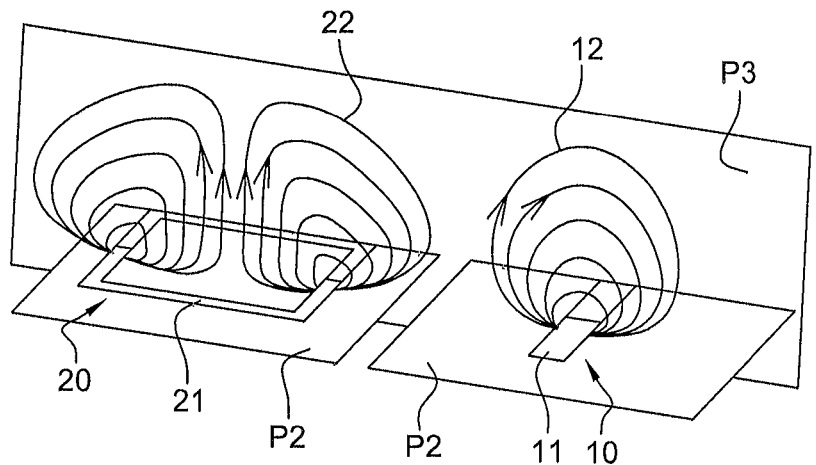
FIG. 1 is a principle diagram showing the coupling phenomenon between a linear resonator and an adjacent loop resonator.

FIG. 1 shows a principle diagram showing the coupling phenomenon between a linear resonator 10 and an adjacent loop resonator 20.

Conventionally, the linear resonator 10 is composed of an electrically conducting radiating element 11 called a strip, that is approximately straight and is connected at its centre or at one of the two ends to the external circuit. At high frequency, the strip 11 is usually placed at a given distance (very small compared with the wavelength) from a conducting plane P2 called the ground plane. The strip 11 may be segmented and hold the capacitors in series or it may be connected to the ground plane P2 through capacitors in parallel depending on the length of the strip 11 and the target resonant frequency.

Conventionally, the loop resonator 20 is formed from an electrically conducting radiating element 21, the shape of which matches the contour of a circle or a regular polygon. This radiating element 21, subsequently called a loop, may be broken down into segments connected to each other by capacitors in order to reduce the resonant frequency and make the current distribution more uniform along the loop.

The terminals of one of the capacitors act as radiofrequency terminals (RF port) for the connection to the external circuit. At high frequency, the loop 21 is usually placed at a given distance (very small compared with the wavelength and the size of the loop 21) from the ground plane P2. Capacitors may also connect the loop 21 to the ground plane P2 depending on the size of the loop 21 and the required resonant frequency.

When the linear resonator 10 is powered by a generator (not shown), the radiating element 11 called the strip located above the ground plane P2 creates a magnetic field, the field lines of which rotate around the strip in a plane P3 perpendicular to the ground plane P2, the field vector being tangent to these lines.

When the loop resonator 20 is powered by a generator (not shown), the radiating element 21 called the loop creates a magnetic field, of which the field lines 22 are perpendicular to the surface S delimited by the loop 21, according to the principle of the Biot-Savart law.

Placing a loop resonator adjacent to a linear resonator, at about the same elevation from the common ground plane P2, a configuration that occurs for example in array antennas used for medical imaging, field lines 12 generated by the electrically powered strip 11 pass through the surface S of the loop 21 and give rise to a non-zero flux that causes an induced current to appear in the loop 21. This induced current creates a counter-field that tends to oppose the flux variation (Lenz's law). This phenomenon causes transmission of power from the linear resonator 10 to the loop resonator 20. Therefore, there is mutual coupling between the two adjacent resonators.

The antenna disclosed according to an embodiment of the invention has a particular architecture that is capable of cancelling or at least strongly reducing the current induced in the loop 21 to prevent the mutual coupling phenomenon between two resonators without adding an additional component.

Figure 2A:
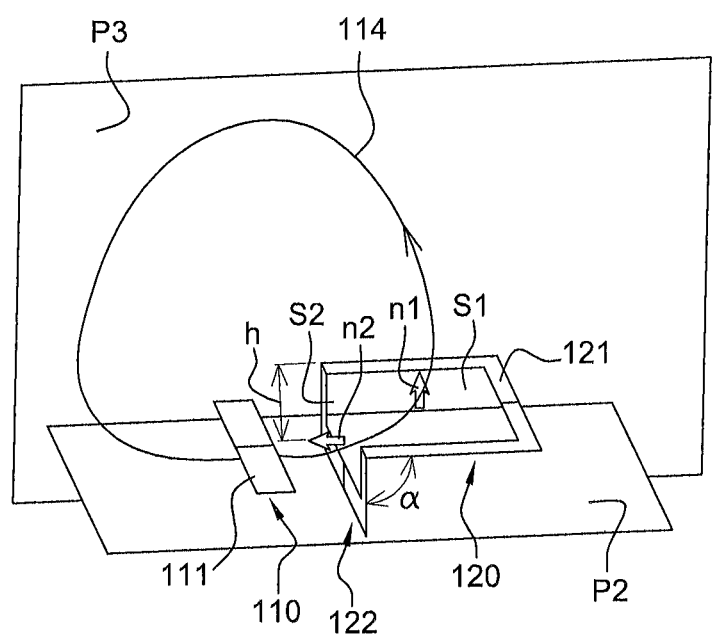
FIG. 2a shows a principle diagram of a first example setup according to an embodiment of the invention for decoupling two adjacent resonators.

FIG. 2a shows a first principle diagram for the antenna installation according to an embodiment of the invention.

The operating principle will be explained based on the simplified principle diagram shown in FIG. 2a that shows a square-shaped loop resonator placed close to a linear resonator.

The linear resonator 110 is a conventional resonator as described above.

The loop resonator 120 is a folded loop with a first plane surface S1 in space called the main surface and a second plane surface S2 called the secondary surface and forming an appendix 122 from the main surface S1. In the simplified example embodiment shown in FIG. 2, the surface S2 forms a right angle from the surface S1. Obviously, the angle of inclination equal to 90° is not limitative and is given only as an example. Similarly, the surfaces S1 and S2 are not limited to plane surfaces.

When the strip 111 is energised, the radiated magnetic field $\vec{H}$ then passes through the two surfaces S1 and S2 formed by the loop 121, creating a first flux $\Phi_1$ and a second flux $\Phi_2$ defined as follows respectively:

$$\Phi_1 = \iint_{S1} \vec{H} \cdot \vec{n}_1 dS,$$

$$\Phi_2 = \iint_{S2} \vec{H} \cdot \vec{n}_2 dS.$$

The field line that passes through the centre of the surface S1 and the centre of the surface S2 is shown as reference 114, for illustrative purposes.

In general, the resonators operate under harmonic conditions. Therefore, Lenz's law can be used to evaluate the induced currents $I_1$ and $I_2$ on the radiating element 121 surrounding the main surface S1 and the secondary surface S2 respectively.

$$I_1 = -\frac{1}{R}\left(\frac{d\Phi_1}{dt}\right)$$

$$I_2 = -\frac{1}{R}\left(\frac{d\Phi_2}{dt}\right)$$

Where:

I is the induced current in amperes;

R is the loop resistance in ohms;

$\Phi$ is the magnetic flux in webers.

Assuming that the amplitude of the radiated magnetic field $\vec{H}$ oriented on reference 114 decreases over a time interval dt, then the special shape of the loop 121 can give a positive induced current $I_1$ and a negative induced current $I_2$, considering the conventional orientation of Lenz's law vectors $\vec{n}_1$ and $\vec{n}_2$. The total induced current I in the loop is the sum of currents $I_1$ and $I_2$. Furthermore, the amplitude of the magnetic field H decreases as the distance from the strip increases, and is therefore higher on surface S2 than on surface S1.

Consequently, an embodiment of the invention consists of creating a surface S2 distinct from the main surface S1 with smaller dimensions than the dimensions of the main surface S1, with an angle of inclination α from the median plane of the surface S1.

The orientation and position of the surface S2 relative to the surface S1, and the size of the surface S2 relative to the surface S1 are determined such that the amplitudes of the induced currents $I_1$ and $I_2$ generated by the presence of the nearby linear resonator 110 are equal, such that the total induced current in the loop resonator 120 cancels out. Thus, the special shape of the loop 121 can decouple two adjacent resonators in a high frequency antenna.

The principle described above remains valid for loops with shapes different from the illustrated square shape.

Therefore, to manufacture an array antenna, a loop resonator 120 should be alternated with a dipole type linear resonator 110, each loop resonator 120 then having two adjacent linear resonators 110. Consequently, the loops 121 must comprises two appendices 122 on each side of the loop 121, the appendices 122 facing the adjacent linear resonators 110 on each side.

For a given strip 111, the appendix 122 furthest from the loop has no significant effect, due to the fast decrease of the field with distance.

Optimum decoupling of an array antenna according to an embodiment of the invention is obtained by an appropriate choice of:

the surface S2 of the appendix that is directly dependent on the height h of the appendix relative to the main surface S1;

the angle α of inclination of the appendix relative to the main surface S1 of the loop.

Beneficially, the ratio of the surface between the secondary surface S2 of the appendix 122 and the main surface S1 of the loop 121 is less than ¼.

Figure 3:
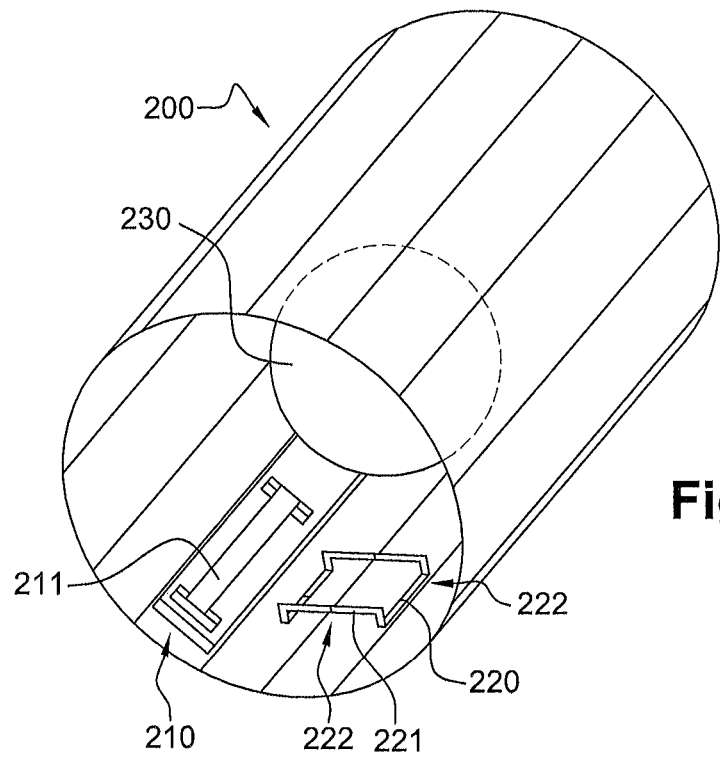
FIG. 3 shows a simplified example of a first embodiment of a high frequency antenna with multiple channels according to the invention.

For example, FIG. 3 shows an example embodiment of a high frequency antenna with multiple channels 200 according to the invention for examination of a human head in an NMR device. The head is simulated by a spherical test dummy 230 with a radius of 78 mm filled with agar gel, the electrical characteristics of which are similar to the characteristics of organic tissue.

The hybrid antenna 200 alternately comprises a loop resonator 220 with a loop 221 with two appendices 222, and a dipole type linear resonator 210 (only one unit of each resonator being shown in FIG. 3).

The strip 211 of the linear resonator 210 is formed by a 140 mm long, 15 mm wide, and 2 mm thick electrical conductor.

The loop 221 is formed by an electrical conductor forming a total surface S delimited by a 66×66 mm square, the electrical conductor having a 2 mm thick and 4 mm wide rectangular cross-section. For use in a 7-Tesla MRI scanner, the loop resonator 220 comprises four 5.8 picofarad (pF) capacitors that are distributed in series on the loop and are placed at the middle of each of the sides of the loop, so as to adjust the resonant frequency to 298 MHz. For this configuration, the height of the appendix 222 that cancels out the total current induced in the loop 221 with dimensions 66×66 mm is between 12 and 13 mm.

By using such a configuration, the transmission coefficients between the loop 221 and the strip 211 that characterise mutual coupling are between −30 dB and −27 dB. For an appendix height of 12 mm; the average field $B_1^+$ in the test dummy 230 that indicates the efficiency of a resonator in transmission is about 0.25 microTesla (μT) for an incident power of 1 W, both for the loop 221 and for the strip 211.

For comparison, if a linear resonator was used instead of the loop resonator described above, or if a loop resonator according to the state of the art was used without the appendices, mutual coupling between the two resonators would be significantly more than −6 dB, −6 dB already being a very poor value in terms of adjustment and performance of the antenna.

By targeting mutual coupling with a value of less than −20 dB, the resolution with which the parameter h (height of the appendix) must be defined is of the order of one millimeter (mm). In practice, it will be impossible to physically modify the appendix to adjust the height h once the appendix has been formed. The modification of the angle of inclination α of the appendix with the main surface S1 of the loop can advantageously be used to modify and adjust mutual coupling so as to minimise it. This operation may be done in various ways; for example by the choice of a conductor cross-section compatible with bending; by placement of hinges with locking elements between the appendices and the main surface S1.

According to one variant embodiment, conductors forming radiating elements of loop resonators may be supported and stiffened by stiffening parts made of low-loss dielectric materials.

The angle of inclination α of the appendices relative to the main surface S1 is advantageously chosen to be between 45° and 135°. Such an inclination interval has a relative variation of the height h equal to ±30%. Thus, the range of variation of the inclination of the appendices is easily sufficient to minimise mutual coupling between two resonators. However, this analysis assumes that the magnetic field does not vary much in the vicinity of the appendix. This condition is satisfied when the height h is of the order of 1% of the wavelength. If the loop resonator has two appendices, these appendices may have different inclinations, particularly as a result of final adjustments necessary to reach minimum mutual coupling.

Beneficially, the linear resonators and loop resonators described in this description are used both in transmission and in reception so as to optimise operation of the antenna.

However, in some applications, it may be sufficient to use only linear resonators in transmission and all resonators (linear and loop) in reception.

In the example embodiment of the array antenna according to the invention, linear resonators may be placed setback from the loop resonators. For example, the strip is beneficially placed at mid-height of the appendix. An offset of the position between the linear resonators and loop resonators makes it possible for example to respect specific absorption rate (SAR) requirements when only linear resonators are used in transmission.

The second example embodiment shown in FIG. 4 is an array antenna 300 with twelve linear resonators 310 distributed in two groups of six resonators 310 placed offset along the longitudinal direction of the antenna 300. With a technology according to the state of the art, the increase in the number of resonators would increase the mutual coupling unacceptably. With an embodiment of the invention, the number of resonators can be increased by adding ten loop resonators 320 according to an embodiment of the invention, and potentially twelve if there are no windows 312 dedicated to visual stimulation used in functional MRI.

It is convenient to use the reciprocity principle to evaluate the reception sensitivity of an array antenna in MRI using digital simulation, and to consider the distribution of $B_1^-$ when a resonator is powered by an incident power of 1 W. The sensitivity associated with the reconstruction of images using the "sum of squares" method for an array antenna with N resonators, is defined by the following relation:

$$S = \sum_i^N |B_{1i}^-|^2$$

Therefore, it is easy to quantify the gain in sensitivity in reception obtained by the addition of 10 decoupled loops according to the invention, by evaluating S at each voxel of the sample using maps of field $B_{1i}^-$ of strips alone or the combination of strips and loops.

The results presented below correspond to maps obtained by digital simulation using the ANSYS HFSS program and an anatomic dummy with two layers: a muscular envelope 313 and an ellipsoid-shaped brain 314. The electrical relative permittivity and the electrical conductivity are 59.5 and 0.78 S/m respectively for the first layer, and 45.3 and 0.87 S/m respectively for the second layer.

The simulations made show an average gain in the ellipsoid of 49%, between the sensitivity in reception of strips alone (state of the art) and the sensitivity of strips combined with loops according to the invention. This gain is not uniform on the three characteristic planes in the ellipsoid-shaped brain. The highest gain is obtained in zones in which the sensitivity in reception of strips alone was lowest, which is in the upper part of the skull. The gain locally reaches 97% in this zone.

The distribution of reception sensitivities in the voxels is shown by the histograms in FIGS. 5a and 5b. The histogram in FIG. 5a shows the distribution of reception sensitivities in voxels for an array antenna according to the state of the art using linear resonators only. The histogram in FIG. 5b shows the distribution of reception sensitivities in voxels for a hybrid array antenna according to an embodiment of the invention shown in FIG. 4. Thus, the histograms show that the average sensitivity is 0.99 μT for the hybrid array (i.e. strip and loop) according to an embodiment of the invention compared with 0.67 μT for a strip array alone. Furthermore, the zones in which the sensitivity in reception is less than 0.5 only contain 2% of the voxels for the hybrid array while they contain 33% for the array with strips only. The invention has been described particularly for use in nuclear magnetic resonance imaging; however the invention is equally applicable to other application fields using a high frequency multiple-channel antenna operating in near field.

The invention has been described particularly for a loop resonator with a radiating element with a first plane main surface and two plane appendices on each side of the main surface. However, the invention is equally applicable with a loop forming a curved first main surface (i.e. with at least one radius of curvature) defined by a median plane and/or two curved appendices (i.e. with at least one radius of curvature) also defined by a median plane.

Figure 2B:
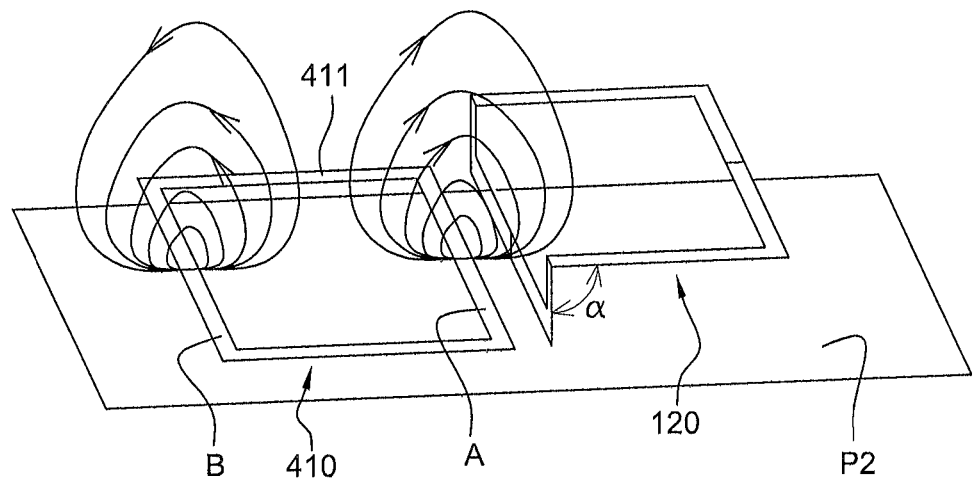
FIG. 2b shows a principle diagram of a second example setup according to an embodiment of the invention for decoupling two adjacent resonators.

FIG. 2b shows a second principle diagram for assembly of the antenna according to an embodiment of the invention which is a variant of the first principle shown in FIG. 2a.

In this variant embodiment, the linear resonator 110 is replaced by a loop resonator 410 formed from an electrically conducting radiating element 411 with a shape that matches the contour of a circle or a regular polygon. The loop resonator 410 is a conventional resonator known to those skilled in the art, as described above in FIG. 1 with reference 20.

In this variant embodiment, the dimensions of the loop resonator 410 are determined such that the magnetic field created by the edge B, in other words the edge furthest from the folded loop resonator 120 and experienced by this folded loop resonator 120, is negligible compared with the magnetic field created by the edge A, in other words the edge closest to the folded loop resonator 120 and experienced by the folded loop resonator 120. For example, it can be assumed that the magnetic field created by the edge B and experienced by the folded loop resonator 120 is negligible when the distance between the two edges A and B is equal to at least five times the distance between the two edges of the folded loop resonator 120.

The invention has been described particularly with reference to an array antenna comprising a loop resonator with two appendices alternating with a dipole type linear resonator. However, in some applications, it is also envisaged that an array antenna could be made comprising a loop resonator with two appendices as described in this application alternating with a loop resonator according to the state of the art (i.e. without appendix), with a width equal to at least five times the width of the folded loop resonator.

The invention claimed is:
1. A multiple-channel antenna comprising:
    a first loop resonator comprising a first radiating element forming a loop;
    a second resonator adjacent to the first loop resonator comprising a second radiating element;
    wherein the first radiating element of the first loop resonator includes:
        a main surface extending in a first median plane;
        a secondary surface extending in a second median plane, the secondary surface delimiting an appendix of said first radiating element placed facing the second resonator, the secondary surface being oriented with an inclination from the first median plane of the main surface;

and wherein said second resonator is a linear resonator with a straight second radiating element.

2. The multiple-channel antenna according to claim 1, wherein the secondary surface delimiting said appendix has smaller dimensions than the dimensions of the main surface.

3. The multiple-channel antenna according to claim 1, wherein a ratio between the secondary surface and the main surface is less than ¼.

4. The multiple-channel antenna according to claim 1, wherein the first radiating element of the first loop resonator has a folding zone delimiting the main surface and the secondary surface.

5. The multiple-channel antenna according to claim 1, wherein the first main surface is a plane or curved surface.

6. The multiple-channel antenna according to claim 1, wherein the secondary surface is a plane or curved surface.

7. The multiple-channel antenna according to claim 1, wherein the angle of inclination $\alpha$ of said appendix relative to the main surface of the first loop resonator is between 45° and 135°.

8. The multiple-channel antenna according to claim 1, wherein said first radiating element of the first loop resonator and said second radiating element of the second resonator are used to transmit a radiofrequency excitation signal and to receive a radiofrequency relaxation signal.

9. The multiple-channel antenna according to claim 1, wherein said first radiating element of the first loop resonator is used to receive a radiofrequency relaxation signal and said second radiating element of the second resonator is used to transmit a radiofrequency excitation signal and to receive a radiofrequency relaxation signal.

10. The multiple-channel antenna according to claim 1, wherein said antenna comprises a third resonator adjacent to the first loop resonator such that the second resonator and the third resonator are placed on each side of said first loop resonator, the first loop resonator having a second appendix placed facing the third resonator and having an inclination relative to the median plane of the main surface.

11. The multiple-channel antenna according to claim 1, wherein the antenna is a high frequency antenna for a nuclear magnetic resonance device.

* * * * *